United States Patent [19]

Mikoshiba et al.

[11] 4,288,765

[45] Sep. 8, 1981

[54] FREQUENCY SELECTOR APPARATUS

[75] Inventors: Nobuo Mikoshiba, Sendai; Shoichi Minagawa, Urawa, both of Japan

[73] Assignee: Clarion Co., Ltd., Tokyo, Japan

[21] Appl. No.: 44,513

[22] Filed: Jun. 1, 1979

[30] Foreign Application Priority Data

Jun. 6, 1978 [JP] Japan .................................. 53/67289

[51] Int. Cl.³ .......................... H03H 9/72; H03H 9/64; H03H 9/68; H03F 7/00
[52] U.S. Cl. ..................................... 333/195; 330/4.5; 330/5.5; 333/153; 357/26
[58] Field of Search ............... 333/193–196, 333/150–155; 357/26; 330/5.5, 5, 4.6, 4.9, 7, 4.5; 331/107 A, 107 R, 155; 307/304; 364/821; 332/29 R, 2, 30 R, 26, 52, 56; 310/313

[56] References Cited

U.S. PATENT DOCUMENTS

| | | | |
|---|---|---|---|
| 3,388,334 | 6/1968 | Adler | 330/5.5 |
| 3,715,674 | 2/1973 | Bahr | 331/107 A |
| 3,882,408 | 5/1975 | Auld | 330/4.6 X |
| 4,081,769 | 3/1978 | Shreve | 333/195 |

FOREIGN PATENT DOCUMENTS 2131899 5/1978 Fed. Rep. of Germany ...... 333/154

*Primary Examiner*—Marvin L. Nussbaum
*Attorney, Agent, or Firm*—Blanchard, Flynn, Thiel, Boutell & Tanis

[57] ABSTRACT

A frequency selector apparatus which effects a frequency selection by providing at least one reflecting electrode at a position adjacent elastic surface wave transducer or transducers provided in an acoustic wave propagation track in a piezoelectric medium so as to reflect a frequency component selected by a parametric interaction with an a.c. electrical signal applied to said reflecting electrode.

11 Claims, 14 Drawing Figures

4,288,765

FREQUENCY SELECTOR APPARATUS

FIELD OF THE INVENTION

This invention relates to a frequency selector apparatus utilizing elastic surface waves.

BACKGROUND OF THE INVENTION

As a frequency selector element employed in a frequency selector apparatus for selectivity outputting a desired frequency component from a signal supplied to the apparatus, there have been widely known (1) a resonance circuit comprised of an electrical inductance (a coil) and a capacitance (a capacitor), (2) an element utilizing a mechanical resonance (a mechanical filter), (3) an element utilizing a bulk resonance of a piezoelectric medium (a ceramic filter, a crystal filter, etc.), and (4) an elastic surface wave filter or resonator.

Among these, the element (1) has such an advantage as a frequency to be selected is variable over a wide range, but, on the other hand, has shortcomings that it is difficult to provide a high quality factor Q, especially high selectivity, due to a resistive component of the element and that the selected frequency is liable to be affected by fluctuation in temperature.

On the other hand, while the elements (2) to (4) advantageously have a high quality factor Q (selectivity), they have a disadvantage that a variable frequency range is narrow since they are intrinsically fixed frequency selector elements.

SUMMARY OF THE INVENTION

It is therefore an object of the present invention to provide a frequency selector apparatus which is capable of widening a variable frequency range and yet highly enhancing the quality factor Q.

In accordance with the invention, there is provided a frequency selector apparatus comprising:

a piezoelectric element;

elastic surface wave transducer means disposed in an acoustic wave propagation track formed in said piezoelectric element;

reflecting electrode means disposed in said acoustic wave propagation track; and exciting power source means connected to said reflecting electrode means.

DETAILED DESCRIPTION

Figure 1:
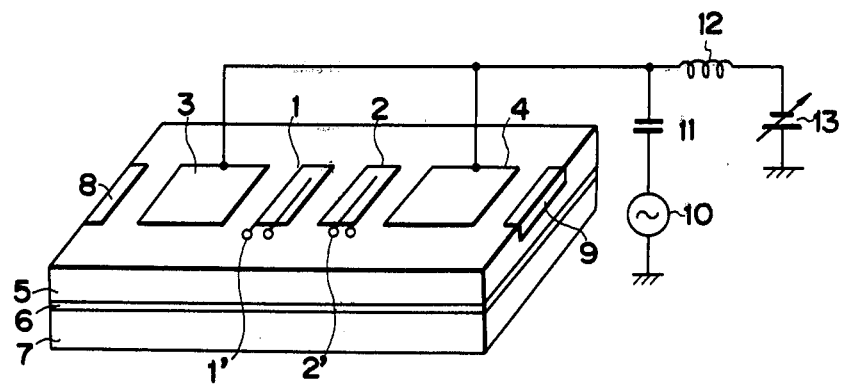
FIG. 1 is a schematic view of a frequency selector apparatus in accordance with a specific embodiment of the invention.

Referring now to the drawings, there are illustrated preferred embodiments of the invention.

FIG. 1 illustrates one form of the frequency selector apparatus in accordance with the invention.

In the Figure, 1 is a signal input transducer, 2 a signal output transducer, 3 and 4 pump electrodes, 5 a piezoelectric film, 6 an insulator film, 7 a semiconductor substrate, 8 and 9 elastic surface wave absorbing members, 10 a pump power source, 11 a capacitor for preventing a d.c. current, 12 an inductor for preventing an a.c. current, and 13 a d.c. bias power source.

The apparatus may be fabricated for example in such a manner that an insulator film 6 such as a silicon dioxide film($SiO_2$) is formed on a semiconductor substrate 7 made of silicon (Si) etc. by thermal oxidation, a piezoelectric film 5 such as a zinc oxide film is formed on the insulator film 6 by sputtering, and a metal such as aluminum (Al) etc. is deposited on the piezoelectric film 5 to subsequently shape electrodes 1 to 4 by photoetching the metal. The electrodes 1 and 2 formed at the central portion of the piezoelectric film surface are comb-like electrodes and function as a signal input and a signal output transducer, respectively.

On the other hand, the electrodes 3 and 4 adjacent to the electrodes 1 and 2, respectively, and disposed at peripheral portions of the piezoelectric film 5 are pump electrodes as mentioned above. The pump electrodes 3 and 4 are connected to the d.c. bias power source 13 through the a.c. current preventing inductor 12 and connected further to the pump power source 10 through the d.c. current preventing capacitor 11.

At opposite ends of an acoustic wave propagation track of the piezoelectric film 5, there are provided the elastic surface wave absorbing members 8 and 9.

The material of the piezoelectric film 5 is not limited to zinc oxide (ZnO) but it may be any piezoelectric material such as lithium niobate ($LiNbO_3$), aluminum nitrate (AlN), cadmium sulfide (CdS), zinc sulfide (ZnS), etc. The semiconductor to be employed in the invention may be either p-type or n-type. The polarity of the d.c. power source 13 for the bias voltage is determined depending on the type of the substrate so as to produce a suitable space charge layer capacity on the surface of the semiconductor substrate 7.

Though the insulator layer 6 is interposed as a stabilizing film between the semiconductor substrate 7 and the piezoelectric film 5 in the embodiment illustrated, the insulator film 6 may be omitted depending on the material employed for the piezoelectric film 5. The apparatus of the invention may have such a formation that a semiconductor film is provided on a piezoelectric substrate.

In the arrangement as mentioned above, the d.c. bias power source 13 applies a d.c. bias voltage to the pump electrodes 3 and 4 so as to produce a suitable space charge layer capacity on the surface of the semiconductor substrate at portions under the electrodes 3 and 4.

An output of the pump power source 10 for generating a pump voltage having a frequency 2f, which is twice as much as a desired frequency, i.e., frequency f to be selected, is applied also to the pump electrodes 3 and 4 through the d.c. current preventing capacitor 11. As a result, the space charge layer capacity on the surface of the semiconductor substrate 7 is excited at a frequency 2f as of the pump voltage. Since the capacity varies depending on the voltage applied, it varies at a frequency 2f.

When an electrical input signal is supplied to a terminal 1' of the signal input transducer 1 having a sufficiently wide band, the input signal is converted to an elastic surface wave signal and propagated along the surface of the piezoelectric film 5 in the leftward and rightward directions as viewed in FIG. 1. Of the elastic surface waves propagated in the leftward direction as viewed in FIG. 1 from the input transducer 1, a component having a frequency f is amplified while it is being propagated through the pump electrode 3 since the piezoelectric potential at the electrode 3 is subjected to a parametric interaction with the pump voltage due to the nonlinearity effect of the space charge layer capacity on the surface of the substrate. At the same time, an elastic surface wave is produced which is propagated rightwardly as viewed in FIG. 1 from the pump electrode 3. The wave has a frequency f and a level corresponding to the level of the input signal. This elastic surface wave is propagated rightwardly as viewed in FIG. 1 and converted to an electrical signal by the signal output transducer 2. Thus, a signal of desired frequency f is outputted from a terminal 2' of the transducer 2.

Similarly, of the elastic surface waves propagated rightwardly as viewed in FIG. 1 from the input transducer 1, a reflected wave having a frequency f and a level corresponding to the level of a signal component of frequency f is propagated leftwardly as viewed in FIG. 1 from the pump electrode 4 and converted to an electrical signal by the output transducer 2.

Figure 2:
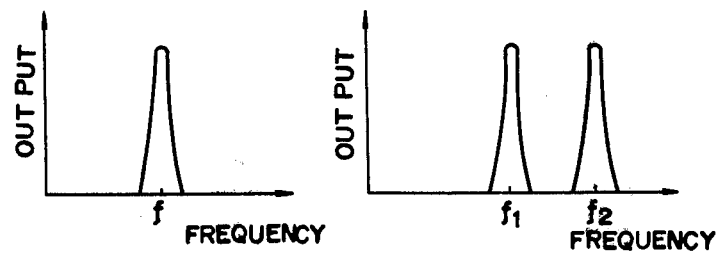
FIG. 2 is characteristic diagrams exemplarily illustrating frequency characteristics of the invention.

The elastic surface waves reflected by the pump electrodes 3 and 4 are mainly formed of components of frequency f and have a level corresponding to that of the input signal and determined depending on the levels of the pump voltage and the bias voltage. The frequency characteristic of the output of the output transducer 2 is as illustrated in FIG. 2(a). Thus, there can be attained a frequency selection of extremely high quality factor Q (selectivity).

On the other hand, a pass band center frequency f taken out from the output transducer 2 may be varied by varying the frequency 2f of the pump voltage of the pump power source 10.

The elastic surface waves passed through the pump electrodes 3 and 4 and propagated therefrom leftwardly and rightwardly, respectively are absorbed by the elastic surface wave absorbers 8 and 9, respectively.

FIGS. 3 to 7 schematically show further forms of frequency selector apparatus in accordance with the present invention.

Figure 3:
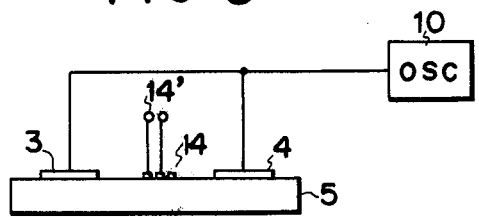
FIGS. 3 to 7 are schematic views of frequency selector apparatuses in accordance with other specific embodiments of the invention.

In the embodiment illustrated in FIG. 3, reflecting electrodes (pump electrodes) 3 and 4 applied only with an a.c. pump voltage of the pump power source 10 are provided on opposite sides of a single elastic surface wave transducer 14 so as to be adjacent thereto, respectively. This embodiment utilizes a change in electrical impedance of the transducer 14 depending on the frequency.

Figure 4:
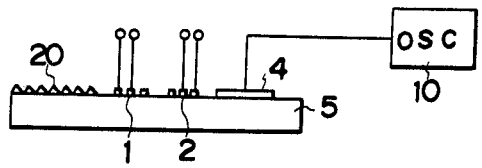

In the embodiment illustrated in FIG. 4, adjacent to an input and an output transducer 1 and 2 in the form of elastic surface wave transducers there are provided, on one side, a regularly jagged member 20 for effecting a mechanical reflection and, on the other side, a reflecting electrode 4 applied with an a.c. voltage from a pump power source 10.

Figure 5:
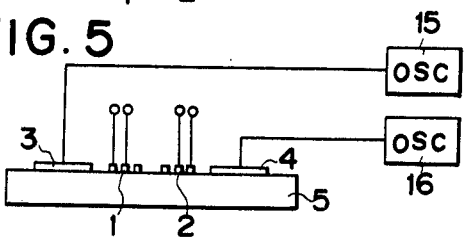

In the embodiment of FIG. 5, two desired frequencies $f_1$ and $f_2$ can be selected. Two pump electrodes 3 and 4 are connected to pump power sources 15 and 16, respectively. The pump power sources 15 and 16 have pump frequencies $2f_1$ and $2f_2$ respectively. The frequency characteristic of an output taken out from the output transducer 2 is as illustrated in FIG. 2(b).

Figure 6:
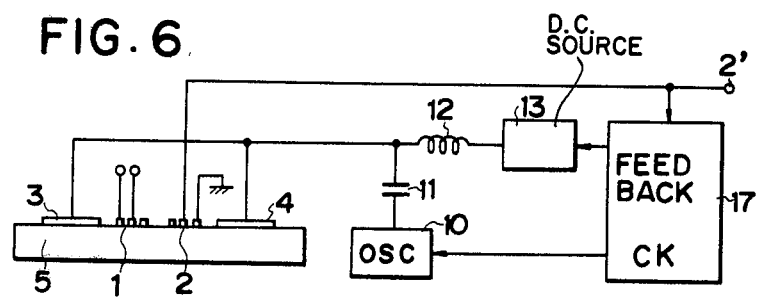

In the embodiment illustrated in FIG. 6, an output of the output transducer 2 to the output terminal 2' is fed back to the d.c. bias power source 13 and the pump power source 10 through a feedback circuit 17 to vary the level of the d.c. bias voltage and the level and/or frequency of the a.c. voltage applied to the pump electrodes 3 and 4 functioning as reflecting electrodes. Thus, the amplitude and/or frequency of the output signal is controlled. In this case, the feedback signal may of course be supplied to one of the power source 13 and 10.

Figure 7:
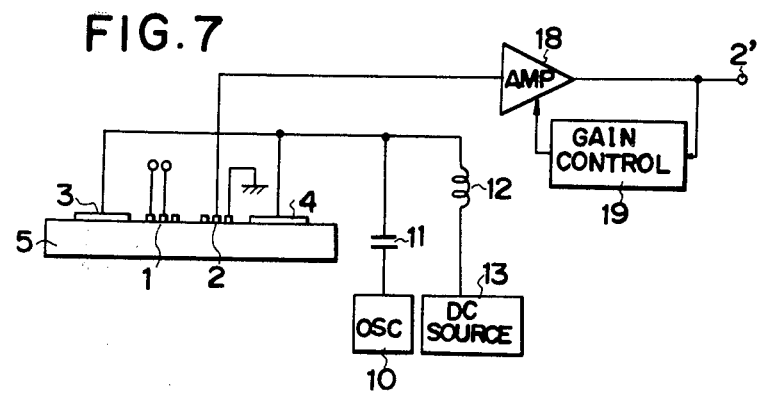

In the embodiment of FIG. 7, a variable gain amplifier 18 and automatic gain control (AGC) circuit 19 are connected to an output side of the output transducer 2 to enable amplitude control of an output signal. These circuits may alternatively be connected to an input side of the input transducer 1.

The circuits additionally employed in the embodiments of FIGS. 6 and 7 may of course be employed in the embodiments of FIGS. 4 and 5.

Although the reflecting electrodes employed in the foregoing embodiments have a uniform thickness, they may be of a repetitive structure such as a comb-like structure. In this case, the frequency of the pump power source is not necessarily twice as much as the desired frequency.

Although the reflecting electrodes are located outward beyond the elastic surface wave transducers in the foregoing embodiments, a reflecting electrode or electrodes may be provided between the transducers.

Figure 8:
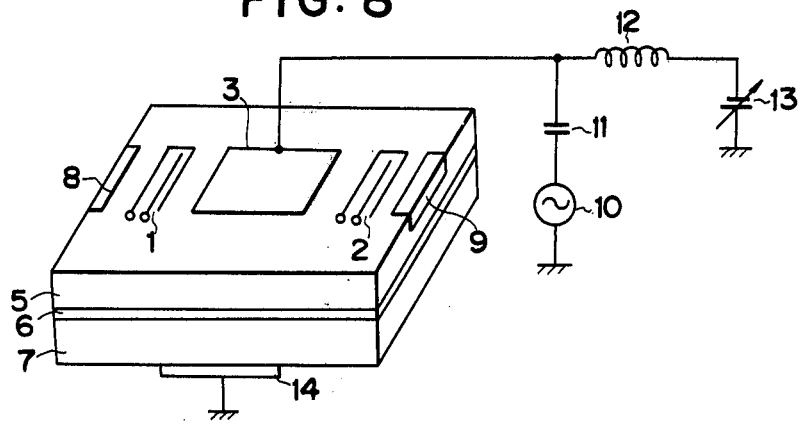
FIG. 8 is a similar schematic view of a frequency selector apparatus in accordance with a further specific embodiment of the invention.
Figure 9:
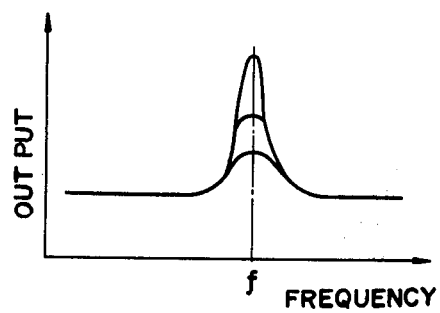
FIG. 9 is a frequency characteristic diagram of the frequency selector apparatus shown in FIG. 8.

FIG. 8 illustrates a still further form of frequency selector apparatus in accordance with the present invention. The amplification-frequency characteristic is as illustrated in FIG. 9. As apparent from the Figure, the pass band width in the amplification characteristic can be narrowed very much. In this case, there can be obtained the following advantages.

(a) The quality factor Q (selectivity) (resonant center frequency/pass band narrowness) can be increased very much. According to the calculation neglecting a loss due to the propagation, the Q value is 22,200 when the gain is 20 dB. In an experiment conducted under the same conditions, the Q value was 11,100.

(b) The pass band center frequency may be changed by varying the pump frequency 2f, so that variable tuning is enabled.

(c) Upon variation of the pump voltage or the d.c. bias voltage, the gain and therefore the Q value may be varied.

When unidirectional elastic surface wave transducers (each adapted to generate an acoustic wave only in one direction for example by providing an appropriate phase difference between terminals thereof) are employed in place of the aforesaid input and output transducers, an adverse influence due to reflection of undesired waves at the transducer portions can be reduced.

Furthermore, where a plurality of pump electrodes are provided and connected to one pump power source 10, the gain is increased at resonant center frequency and the ratio of undesired frequency component response to center frequency response is reduced. Thus, the characteristics as a resonator are improved.

Figure 10:
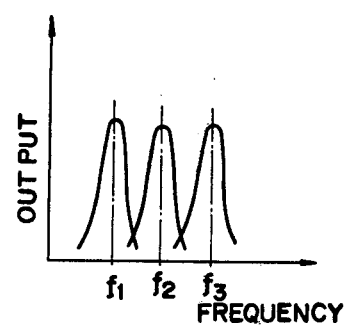
FIGS. 10 and 12 are frequency characteristic diagrams of frequency selector apparatuses in accordance with still further embodiments of the invention.

Alternatively, where the pump electrodes are connected to pump power sources of different frequencies, the amplification band can be freely selected because the elastic surface wave signal is subjected to amplification at different resonant center frequencies as illustrated in FIG. 10 when the signal passes through the electrodes.

Figure 13:
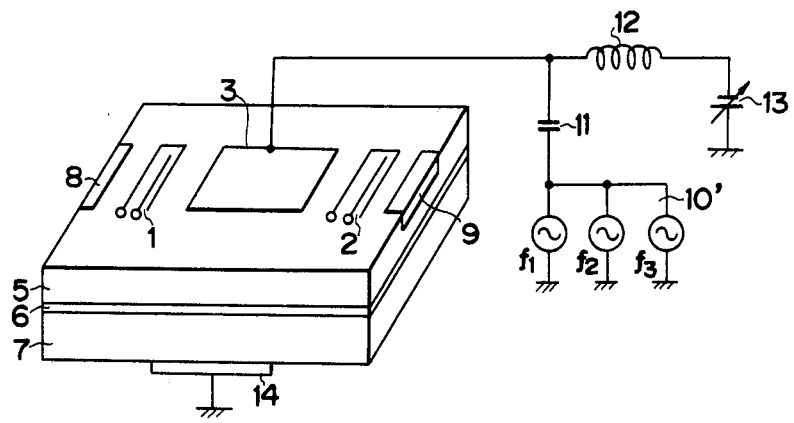
FIGS. 13 and 14 are schematic views of frequency selector apparatuses in accordance with still further embodiments of the invention.

Further alternatively, where a plurality of pump power sources 10' of different frequencies are provided as illustrated in FIG. 13 and pump power having a plurality of frequency components is simultaneously applied to the pump electrode 3, the frequency characteristic similar to that of FIG. 10 is obtained and the amplification band can be freely selected.

Figure 11:
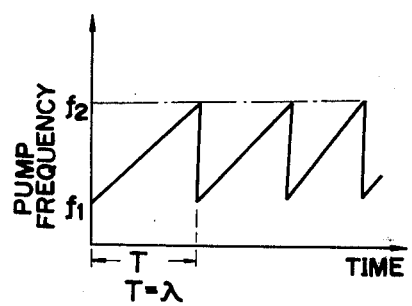
FIG. 11 is a diagram of one form of pump a.c. signal operative in the invention.
Figure 14:
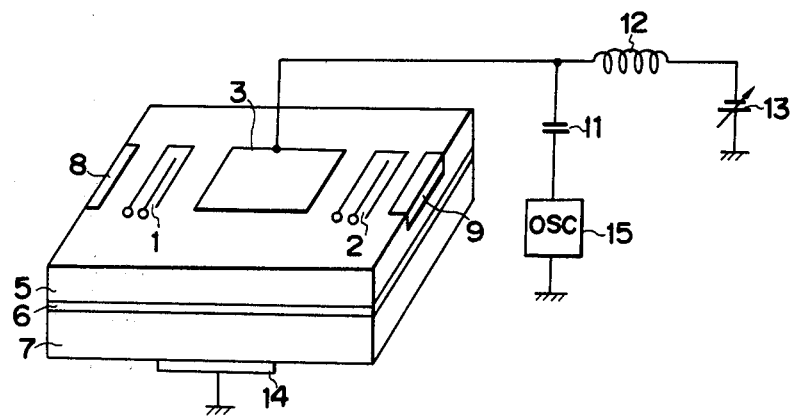

Further, as illustrated in FIG. 14, an oscillator 15 for generating signal having a frequency f varying with a time t (e.g. a signal as illustrated in FIG. 11) is employed as a pump power source, the output frequency band is widened because the amplification center frequency is subjected to variation while the elastic surface wave is being propagated from end to end of the pump electrode. The output frequency band is varied according to the way the frequency of the pump power source changes with time and can be arbitrarily set.

Figure 12:
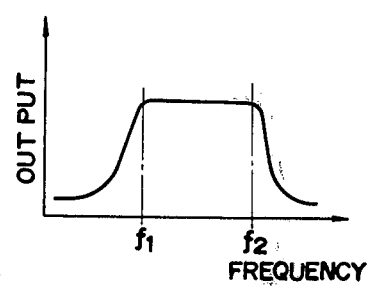

For example, where a signal as illustrated in FIG. 11, whose frequency varies linearly with time, is used as a pump signal, if a repeating cycle T is designed as a time $\tau$ required for the elastic surface wave to pass through the pump electrode, the frequency characteristic obtained has a planar portion at a frequency band f1 - f2 as illustrated in FIG. 12.

As apparent from the foregoing description, the invention has the following effects:
(a) The quality factor Q (selectivity) can be improved.
(b) The resonant center frequency can be varied.
(c) The quality factor Q (selectivity) can be varied.
(d) Undesired deviation of the center frequency due to a temperature fluctuation and/or deterioration with age as involved in a conventional resonator can be eliminated by employing a crystal oscillator or frequency synthesizer oscillator of high stability as a pump power source. This is enabled because the resonant center frequency is determined as $\frac{1}{2}$ of the frequency of the pump power source in accordance with the invention.
(e) Since the resonator of the invention essentially utilizes a parametric amplification function, not only a loss etc. at the elastic surface wave transducer portion may be compensated for by an amplification gain, but even an amplified electric output can be obtained at the output terminal thereof.

Although the input and the output transducer are employed in the embodiments illustrated, they are not requisite to the invention, and elastic surface waves may be inputted or outputted for example by employing a suitable wave guide.

As mentioned above, in accordance with the invention, the range of the selectable frequency can be varied over a wide range and the selectivity of the desired frequency is much improved.

In addition, since the stability of the selected frequency is determined by the stability of an external oscillator, it can be raised very much according to the stability of the oscillator employed.

We claim:

1. A frequency selector apparatus comprising:
a piezoelectric element;
elastic surface wave transducer means disposed in an acoustic wave propagation track formed in said piezoelectric element, said elastic surface wave transducer means comprising a signal input transducer and a signal output transducer;
reflecting electrode means disposed in said acoustic wave propagation track; and
exciting power source means connected to said reflecting electrode means, wherein said exciting power source means comprises an a.c. signal source and a d.c. bias source.

2. A frequency selector apparatus of claim 1 which further comprises means for controlling at least one of a d.c. signal from the d.c. bias source and an a.c. signal from the a.c. signal source to be applied to said reflecting electrode means, in response to an output signal of the signal output transducer.

3. A frequency selector apparatus of claim 1 which further comprises a variable gain amplifier connected to an output of the signal output transducer.

4. A frequency selector apparatus of claim 1 which further comprises a variable gain amplifier connected to an input of the signal input transducer.

5. A frequency selector apparatus comprising:
a piezoelectric element;
elastic surface wave transducer means disposed in an acoustic wave propagation track formed in said piezoelectric element;
reflecting electrode means disposed in said acoustic wave propagation track, wherein said reflecting electrode means comprises reflecting electrode members disposed on opposite sides of the elastic surface wave transducer means;
exciting power source means connected to said reflecting electrode means.

6. A frequency selector apparatus of claim 5 wherein said exciting power source means is adapted to generate a.c. signals of different frequencies each of which is applied to a said reflecting electrode member.

7. A frequency selector apparatus comprising:
a piezoelectric element;
elastic surface wave transducer means disposed in an acoustic wave propagation track formed in said piezoelectric element;
reflecting electrode means disposed in said acoustic wave propagation track;
exciting power source means connected to said reflecting electrode means; and means for mechanically reflecting elastic surface waves which is adjacent the elastic surface wave transducer means.

8. A frequency selector apparatus comprising:
a piezoelectric element;
elastic surface wave transducer means disposed in an acoustic wave propagation track formed in said piezoelectric element;
reflecting electrode means disposed in said acoustic wave propagation track; and
exciting power source means connected to said reflecting electrode means, wherein said elastic surface wave transducer means comprises a single signal transducer and said reflecting electrode means has reflecting electrode members disposed on opposite sides of said transducer, said reflecting electrode members being applied only with an a.c. pump voltage from the exciting power source means.

9. A frequency selector apparatus comprising:
a piezoelectric element;
elastic surface wave transducer means disposed in an acoustic wave propagation track formed in said piezoelectric element;
reflecting electrode means disposed in said acoustic wave propagation track; and
exciting power source means connected to said reflecting electrode means, wherein said reflecting electrode means comprises a single reflecting electrode member and said signal input transducer and said signal output transducer are disposed on opposite sides of said reflecting electrode member.

10. A frequency selector apparatus of claim 9 wherein said exciting power source means is adapted to generate a.c. signals of different frequencies which are applied to the reflecting electrode member.

11. A frequency selector apparatus of claim 9 wherein said exciting power source means is adapted to generate a signal whose frequency varies with time.

* * * * *